(12) United States Patent
Harada

(10) Patent No.: US 6,312,761 B1
(45) Date of Patent: Nov. 6, 2001

(54) FILM FORMING METHOD FOR PROCESSING TUNGSTEN NITRIDE FILM

(75) Inventor: Masamichi Harada, Chigasaki (JP)

(73) Assignee: Ulvac, Inc., Kanagawa (JP)

( * ) Notice: Subject to any disclaimer, the term of this patent is extended or adjusted under 35 U.S.C. 154(b) by 0 days.

(21) Appl. No.: 09/489,338

(22) Filed: Jan. 21, 2000

(30) Foreign Application Priority Data

Jan. 22, 1999 (JP) .................................................. 11-013791

(51) Int. Cl.[7] .................................................. C23C 16/22
(52) U.S. Cl. .................................. 427/255.394; 427/585
(58) Field of Search .............................. 427/585, 255.394

(56) References Cited

U.S. PATENT DOCUMENTS

| | | | |
|---|---|---|---|
| 5,112,185 | 5/1992 | Koike | 414/786 |
| 5,470,800 | 11/1995 | Muroyama | 437/238 |
| 5,534,072 | 7/1996 | Mizuno et al. | 118/728 |

FOREIGN PATENT DOCUMENTS

| | | |
|---|---|---|
| 3-255624 | 11/1991 | (JP) . |
| 8-325737 | 12/1996 | (JP) . |

OTHER PUBLICATIONS

Copy of European Patent Office Communication for European Patent Application No. 00100937.2 including European Search Report dated May 17, 2000.

*Primary Examiner*—Bernard Pianalto
(74) *Attorney, Agent, or Firm*—Armstrong, Westerman, Hattori, McLeland & Naughton, LLP

(57) ABSTRACT

A tungsten nitride film, having a high growth speed without causing any dusting, is formed. The film forming apparatus 2, according to the present invention, includes an adhesion preventive container 8 which is placed in a reactor 11; and an object on which a film is to be formed 20 is located in the adhesion preventive container 8. In a first gas inlet equipment, a first feedstock gas is jetted from a shower nozzle 12. In a second gas inlet equipment, a second feedstock gas is jetted around the object on which a film is to be formed 20 between the shower nozzle 12 and the material 20. The first feedstock gas and the second feedstock gas attain the surface of the object on which a film is to be formed without being mixed together, which enables the efficient performance of the reaction. Since the adhesion preventive container is heated to 150 to 250° C., neither $WF_6 \cdot 4NH_3$ nor $W_xN$ is formed and thus, no dusting is caused.

8 Claims, 3 Drawing Sheets

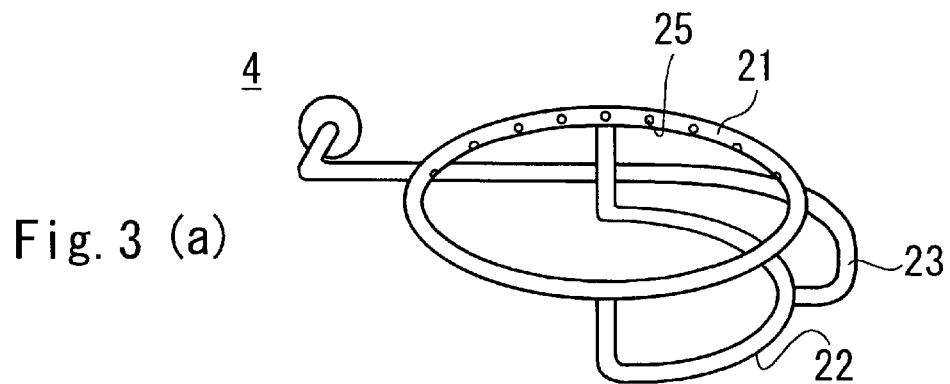
Fig. 3 (a)
Fig. 3 (b)
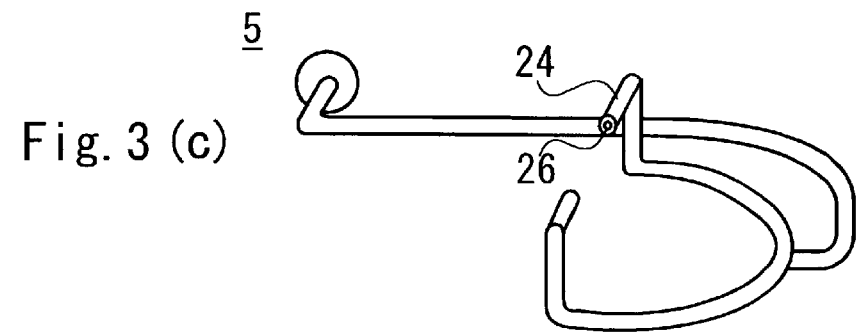
Fig. 3 (c)
Fig. 4 (a)
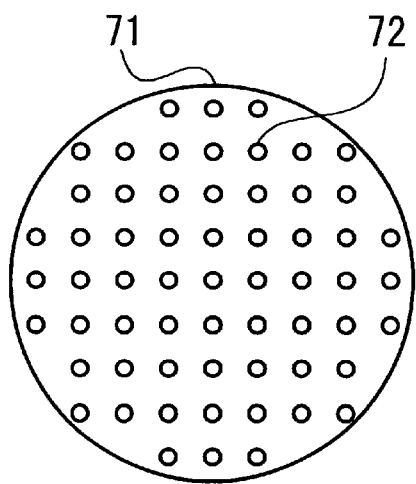
Fig. 4 (b)
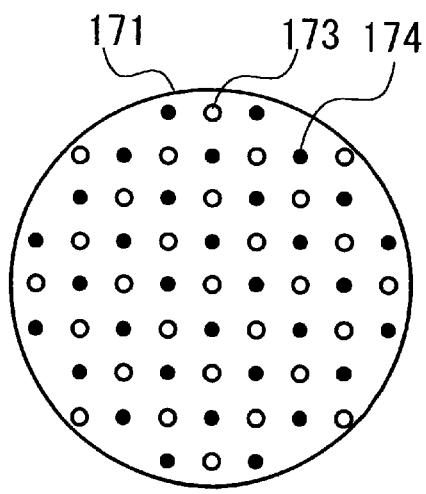

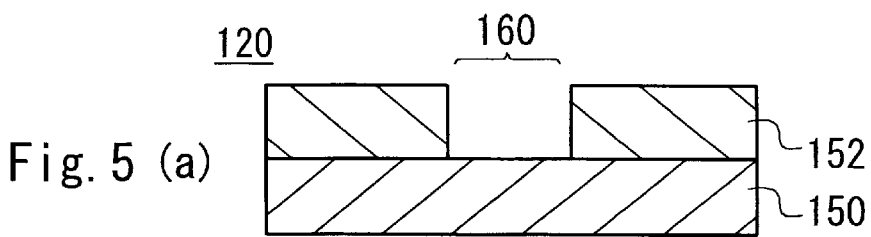
Fig. 5 (a)
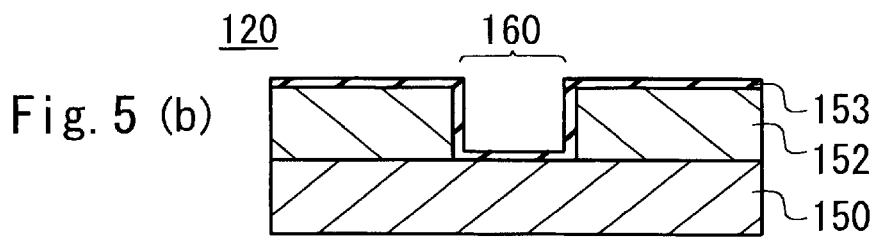
Fig. 5 (b)
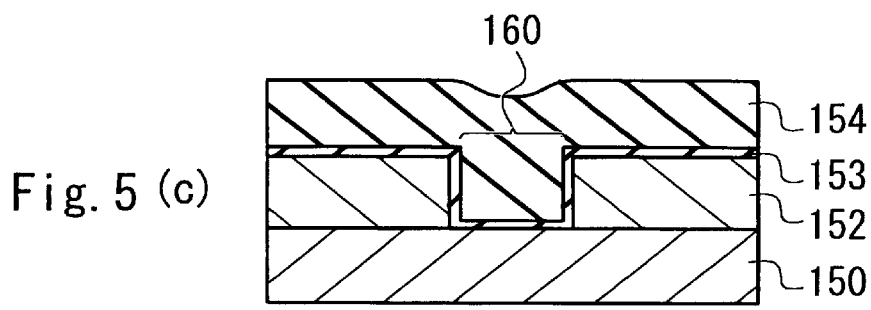
Fig. 5 (c)
Fig. 6  Prior art
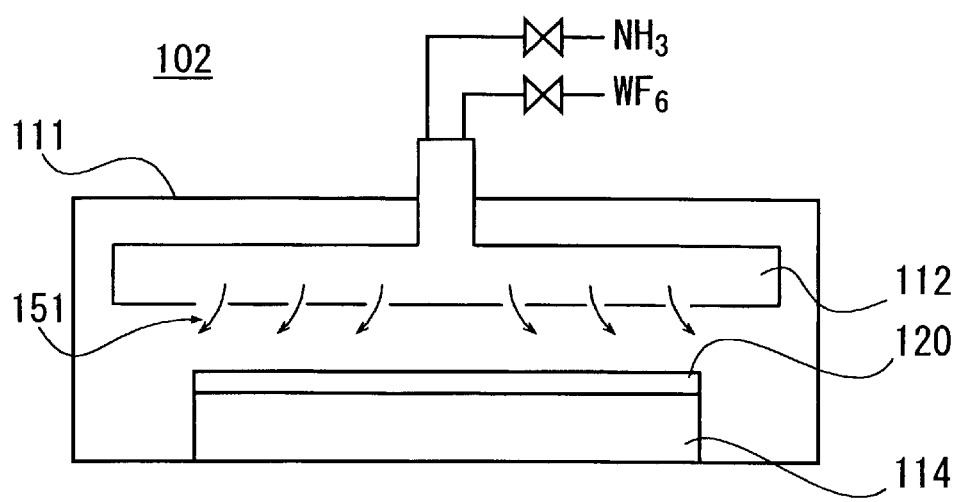

FILM FORMING METHOD FOR PROCESSING TUNGSTEN NITRIDE FILM

FIELD OF THE INVENTION

This invention generally relates to the technical field of forming metal nitrides. More particularly, it provides a technique adequate for forming tungsten nitride films.

BACKGROUND OF THE INVENTION

In recent years, aluminum has been replaced by copper as the material mainly employed in metal interconnecting films for semiconductor devices. In the case of aluminum films, titanium nitride films are formed as barrier films at the interface between the aluminum films and silicon substrates. However, these titanium nitride films are poor in it's ability to prevent the diffusion of copper. Thus, $W_xN$ films (tungsten nitride films) have attracted attention as barrier films against copper films.

It has been a practice to produce $W_xN$ films at a high temperature (i.e., 500° C. or above) under high pressure (i.e., film-forming pressure: several thousand Pa). However, a large-scale apparatus is employed to sustain such a high pressure; and, in addition, troublesome operations are needed for the maintenance thereof. In a pretreatment apparatus for forming $W_xN$ films and a film forming apparatus for forming copper film on the $W_xN$ films, substrates should be treated in vacuum. Thus, there arises an additional problem that these apparatuses are poor in connection properties with a $W_xN$ film forming apparatus; and thus, the substrates cannot be treated continuously.

Accordingly, it has been required to develop a film forming apparatus by which $W_xN$ films can be produced in vacuum (under reduced pressure). In FIG. 5(a), a substrate 120, on which a $W_xN$ film and a copper film are to be formed, consists of a silicon substrate 150, a silicon oxide film 152 formed on the silicon substrate 150 and a pore 160 formed in the silicon oxide film 152.

When a $W_xN$ film is to be formed on the substrate 120 by using a CVD apparatus 102 of the prior art as shown in FIG. 6, a reactor 111 is first evacuated. Then, the substrate 120 is carried thereinto and placed on a holder 114 provided in the bottom side of the reactor 111.

A shower nozzle 112 is provided in the ceiling side of the reactor 111. After heating the substrate 120 to a prescribed temperature with a heater contained in the holder 114, two types of feedstock gases (for example, $WF_6$ gas and $NH_3$ gas) are jetted from the shower nozzle 112 toward the substrate 120 as shown by arrows 151, thereby inducing the following chemical reaction:

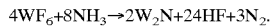

$$4WF_6 + 8NH_3 \rightarrow 2W_2N + 24HF + 3N_2.$$

Thus, a $W_xN$ film 153 is formed on the surface of the substrate 120 as shown in FIG. 5(b), wherein X is referred tentatively as to 2.

When a prescribed thickness of the $W_xN$ film is achieved, the substrate 120 is taken out from the reactor 111. Then, a copper film 154 is formed on the $W_xN$ film 153 as shown in FIG. 5(c) and followed by the transportation to the subsequent stage, i.e., the patterning of the copper film 154, etc.

When the $W_xN$ film 153 and the copper film 154 are formed in a vacuum as described above, the substrate 120 can be continuously treated without exposing to the atmosphere by connecting an apparatus for forming a tungsten film and a apparatus for forming a copper film to a multi-chamber type apparatus.

However, a CVD apparatus of the prior art as described above suffers from the problem of serious dusting. This is because the reaction between $WF_6$ and $NH_3$ proceeds even at room temperature, and not $W_xN$ but $WF_6 \cdot 4NH_3$ etc. are formed at room temperature, different from the above reaction formula, and adhere to the inner wall of the reactor 111.

When the wall of the reactor 111 is heated to a temperature close to the temperature of the substrate 120, at least the formation of $WF_6 \cdot 4NH_3$ can be prevented. In this case, however, $W_xN$ is deposited on the inner wall of the reactor 111 on the contrary and causes dusting.

In addition, the above-described reactor 111 of the prior art suffers from another problem of a low growth speed of the $W_xN$ film. Thus, it has been required to clarify the cause of this phenomenon and to establish an effective countermeasure.

SUMMARY OF THE INVENTION

The present invention, which has been made to overcome the above-described problems encountered in the prior art, aims at providing a technique for forming a tungsten nitride film without causing dusting, and a technique for forming a tungsten nitride film showing a high growth speed.

In order to achieve these objects, the present invention relates to a film forming apparatus provided with an evacuatable reactor, an adhesion preventive container placed in said reactor, a holder whereby an object on which the film is to be formed is located in said adhesion preventive container, a first gas inlet equipment which faces said holder and constructed so that it can jet a gas into said adhesion preventive container, and a second gas inlet equipment which is constructed so that it can jet a gas between said first gas inlet equipment and said holder.

The present invention relates to the film forming apparatus, which is constructed so that, in said adhesion preventive container, at least the part around said material on which the film is to be formed is maintained at a temperature of 150 to 300° C.

The present invention relates to the film forming apparatus wherein said first gas inlet equipment has a shower nozzle provided with a number of gas jet orifices formed on the almost same plane.

The invention relates to the film forming apparatus wherein said second gas inlet equipment has a nozzle made of a hollow pipe shaped into a ring and a number of gas jet orifices are formed in said hollow pipe.

The present invention relates to a method for producing a tungsten film which comprises jetting a first feedstock gas having a nitrogen atom in its chemical structure and a second feedstock gas having a tungsten atom in its chemical structure into a reactor and reacting said first feedstock gas with said second feedstock gas so as to form a tungsten nitride film on the surface of a material on which the film is to be formed, wherein the distance between the position from which said first feedstock gas is jetted and the surface of said material on which the film is to be formed is different from the distance between the position from which said second feedstock gas is jetted and the surface of said material on which the film is to be formed.

The present invention relates to the method for producing a tungsten film which comprises providing an adhesion preventive container in said reactor and placing said object on which a film is to be formed in the adhesion preventive container; heating, in said adhesion preventive container, at least the part around said material on which the film is to be formed to a temperature of 150 to 250° C.; and jetting said first feedstock gas and second feedstock gas into said adhesion preventive container.

The present invention relates to the method for producing a tungsten film, wherein one of said first feedstock gas and second feedstock gas is jetted downward in the vertical direction toward the surface of said object on which a film is to be formed.

The present invention relates to the method for producing a tungsten film, wherein, between said first feedstock gas and second feedstock gas, the one gas jetted from the lower position is jetted sideways toward the center of said object on which a film is to be formed.

Many other features, advantages and additional objects of the present invention will become apparent to those versed in the art upon making reference to the detailed description which follows and the accompanying sheet of drawings.

BRIEF DESCRIPTION OF THE DRAWINGS

FIG. 3(a) is a perspective view of the nozzle shaped into a ring;

FIG. 3(b) is an enlarged partial view thereof; and

FIG. 3(c) is a perspective view of a nozzle in another shape.

FIG. 4(a) is a plan view of an example of the shower nozzle of the present invention; and FIG. 4(b) is a plan view of a shower nozzle of the prior art.

FIGS. 5(a)–(c) are drawings which show the steps of forming a tungsten nitride film and a copper film.

FIG. 6 is a drawing which shows an apparatus for forming a tungsten nitride film of the prior art.

DETAILED DESCRIPTION OF THE INVENTION

Figure 1:
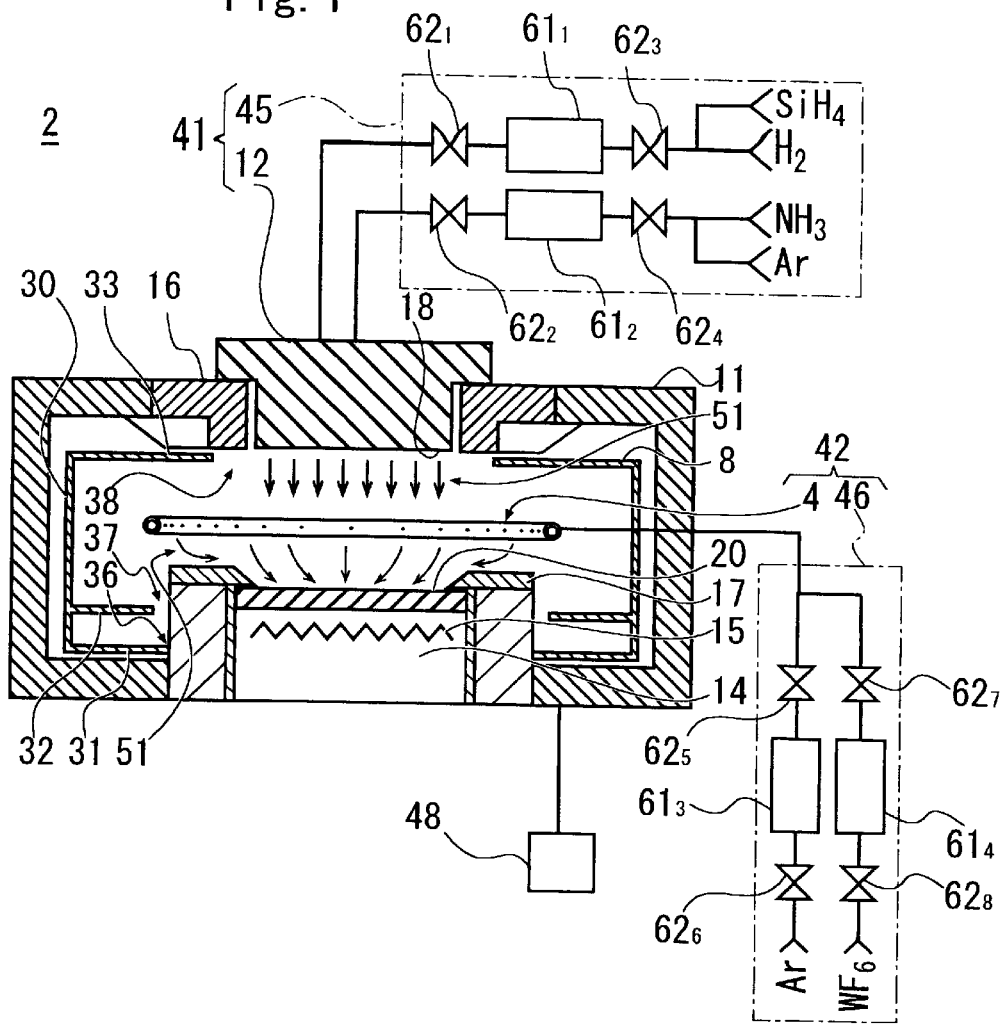
FIG. 1 is a drawing which shows an example of the film forming apparatus according to the present invention.

The film forming apparatus according to the present invention, which has the constitution as described above, has an adhesion preventive container placed in the reactor. In this adhesion preventive container, a holder is provided so that an object on which a film is to be formed (i.e., the substrate) can be held in the adhesion preventive container.

This film forming apparatus is provided with a first gas inlet equipment and a second gas inlet equipment through which feedstock gases are respectively jetted into the adhesion preventive container. The second gas inlet equipment is located at such a position that it can jet the gas between the jetting position of the first gas inlet equipment and the holder.

By locating the gas jetting positions of the first and second gas inlet equipment at different heights on the surface of the object on which a film is to be formed and jetting the feedstock gases into the adhesion preventive container, the first and second feedstock gases respectively jetted from the gas inlet equipment can attain the surface of the object on which a film is to be formed located on the holder without mixing with each other even under pressure within the viscous flow region (i.e., 1.0 to 100 Pa).

When the first feedstock gas having a nitrogen atom in its chemical structure and the second feedstock gas having a tungsten atom in its chemical structure are supplied respectively from the first gas inlet equipment and the second gas inlet equipment, therefore, these gases react with each other not in the space but on the surface of the object on which a film is to be formed and thus, a tungsten nitride film can be efficiently formed.

A tungsten film having a good film thickness distribution can be formed on the surface of the object on which a film is to be formed by providing the first gas inlet equipment with a shower nozzle and thus jetting downward the feedstock gas toward the object on which a film is to be formed. FIG. 4(a) 71 shows the surface of the shower nozzle. On this shower nozzle which has a number of jet orifices 72, the same feedstock gas is jetted.

In the shower nozzle 171 of the prior art shown in FIG. 4(b), two type s of gas jet orifices 173 and 174 are formed. From one type 173 of these orifices, a feedstock gas containing nitrogen atom is jetted, while another feedstock gas containing tungsten atom is jetted from the remainders 174. In this case, these gases are mixed together and react with each other before attaining the surface of the object on which a film is to be formed, which supposedly results in the low film formation (deposition)rate achieved by the prior art.

In the present invention, a nozzle shaped into a ring is further provided in the second gas inlet equipment. This nozzle has a number of gas jet orifices from which a gas is jetted toward the center of the ring, optionally somewhat shifting toward the object on which a film is to be formed. Thus, the feedstock gas supplied from the second gas inlet equipment can uniformly attain the surface of the object on which a film is to be formed.

In this case, the feedstock gas supplied from the first gas inlet equipment attains the surface of the object on which a film is to be formed via the center of the ring of the nozzle. Therefore, the gases supplied respectively from the first and second gas inlet equipment can attain the surface of the object on which a film is to be formed, without being mixed together and thus, the reaction can efficiently proceed on the surface of the object on which a film is to be formed.

When a feedstock gas containing nitrogen in its chemical structure (for example, $NH_3$ gas) and another feedstock gas containing tungsten in its chemical structure (for example, $WF_6$ gas) are separately introduced into the adhesion preventive container in particular under a pressure of from 1.0 to 100 Pa, $WF_6 \cdot 4NH_3$ is formed at a temperature less than 150° C. while a $W_xN$ (i.e., a tungsten nitride film) is formed at a temperature exceeding 300° C.

In the present invention, the adhesion preventive container is maintained at a temperature of from 150 to 250° C. (preferably around 200° C.). As a result, neither $WF_6 \cdot 4NH_3$ nor $W_xN$ is formed on the surface of the adhesion preventive container, thereby causing no dusting.

These and other objects of the invention will become more apparent in the detailed description and examples which follow.

Now, the present invention will be described by reference to the attached drawings.

In FIG. 1, sign 2 shows an example of the film forming apparatus according to the present invention which has a reactor 11. A cavity adhesion preventive container 8 is placed in this reactor 11.

Figure 2:
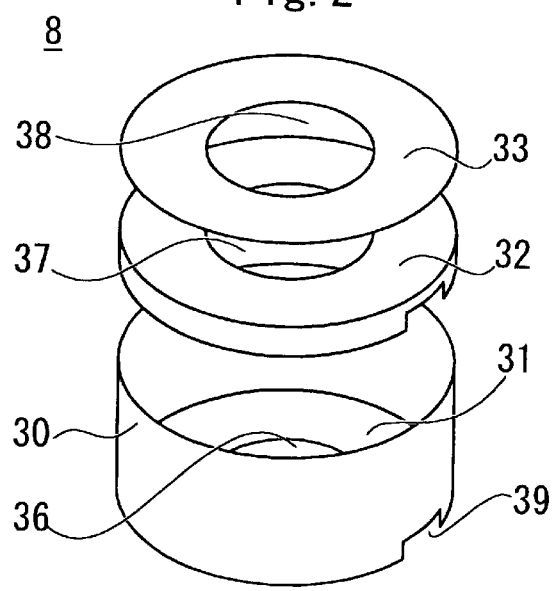
FIG. 2 is a drawing which illustrates the adhesion preventive container of the film forming apparatus.

As FIG. 2 shows, this adhesion preventive container 8 is provided with a bottom plate 31, a rectifier plate 32 and a top plate 33, each in a circular shape, and a cylindrical wall plate 30.

Circular holes 36 to 38 are formed at the center of the bottom plate 31, the rectifier plate 32 and the top plate 33 respectively.

The bottom plate 30 is located at the bottom of the wall plate 30, while the rectifier plate 32 is located above the bottom plate 31 and surrounded by the wall plate 30. The top plate 33 is located at the opening of the wall plate 30 above the rectifier plate 32.

The bottom plate 31, the rectifier plate 32 and the top plate 33 are arranged in parallel at definite intervals, each being fixed to the wall plate 30.

The holes 36 to 38, respectively formed on the bottom plate 31, the rectifier plate 32 and the top plate 33, are each arranged in such a manner that the center thereof is located on the center axis of the wall plate 30.

The adhesion preventive container 8 having the above-described constitution is placed as such on the bottom of the reactor 11.

The reactor 11 is provided with a holder 14 on the bottom thereof and the adhesion preventive container 8 is placed so that the holder 14 is located in the hole 36 of the bottom plate 31 and the hole 37 of the rectifier plate 32. The surface of the holder 14 is located between the rectifier plate 31 and the top plate 33.

A first gas source 45 and a second gas source 46, each consisting of a gas cylinder, a mass flow controller, valves, pipes, etc., are provided outside the reactor 11.

In FIG. 1, $61_1$ to $61_4$ are mass flow controllers, and $62_1$ to $62_8$ are valves.

The first gas source 45 is connected to a shower nozzle 12 as a first gas inlet equipment. A first gas inlet system consists of this first gas source 45 and the shower nozzle 12 which is a first gas inlet equipment.

The shower nozzle 12 has a cavity structure and a number of orifices are formed on the bottom 18 thereof. Thus, a gas is supplied from the first gas source 45 into the cavity part of shower nozzle 12, is jetted from the orifices on the bottom.

The shower nozzle 12 is located above the hole 38 of the top plate 33 and attached to the top part of the reactor 11 so that the bottom 18 of the shower nozzle 12 faces the surface of the holder 14.

The hole 38 of the top plate 33 is larger than the bottom 18 of the shower nozzle 12. The bottom 18 of the shower nozzle 12 is located almost at the same height as the top plate 33, but the bottom 18 is located lower than the hole 38 of the top plate 33.

Due to this construction, the gas jetted from the shower nozzle 12 is introduced directly into the adhesion preventive container 8 and blown to the surface of the holder 14.

The second gas source 46 is connected to a gas jet member 4 as a second gas inlet equipment. A second gas inlet system 42 consists of the second gas source 46 and the gas jet member 4 which is a second gas inlet equipment.

This gas jet member 4, which is roughly shaped into a ring, is arranged between the holder 14 and the shower nozzle 12 in the adhesion preventive container 8 in parallel to the surface of the holder 14. Namely, the gas jet member 4 is located between the rectifier plate 32 and the top plate 33, and in parallel to the rectifier plate 32 and the top plate 33.

FIG. 3($a$) is a perspective view of the gas jet member 4.

This gas jet member 4 consists of a ring nozzle 21, a support 22 supporting this nozzle 21, and a pipe 23 with which the support 22 is connected to the gas inlet system 42 which is located outside of the reactor 11.

The nozzle 21, the support 22 and the pipe 23 are each made up of a hollow pipe. When a gas is introduced from the second gas source 46 into the gas jet member 4, the gas passes through the pipe 23 and the support 22 and attains the nozzle 21.

The gas nozzle 21, shaped into a ring is provided a number of holes 25 on the inner face thereof. FIG. 3($b$) is an enlarged view of the holes 25. These holes 25 are arranged on a somewhat lower part of the surface of the ring gas nozzle 21 at almost constant intervals so that the gas flown into the nozzle 21 is regularly discharged from these holes 25 somewhat downward toward the center.

Next, a method for forming a tungsten film by using the above-described film forming apparatus 2 will be illustrated.

In this case, the first gas source 45 is provided with a gas cylinder containing the first feedstock gas comprising a nitrogen atom in its chemical structure ($NH_3$ in this case), while the second gas source 46 is provided with another gas cylinder containing the second feedstock gas comprising a tungsten atom in its chemical structure ($WF_6$ in this case), thereby allowing the introduction of these gases respectively from the first and second gas inlet systems 41 and 42 into the reactor 11.

First, the reactor 11 is evacuated into vacuum atmosphere with the evacuation system 48 connected to the reactor 11. The substrate holder 17 is made operable so as to be able to lift up and down. Then, the substrate 20 is carried into the reactor 11 while lifting up the substrate holder 17 and placed on the holder 14. This substrate 20 is arranged in parallel to the bottom 18 of the shower nozzle 12. Next, the substrate holder 17 is taken down and the substrate 20 is adhered to the holder 14 followed by heating by switching on the heater 15.

When another inner heater provided within the adhesion preventive container 8 is also switched on, the adhesion preventive container 8 is heated with the inner heater as well as the heat radiated from the holder 14. In this step, the electricity supplied to the inner heater is controlled so as to maintain the temperature of the adhesion preventive container 8 to 200° C.

When the temperature of the substrate 20 is elevated and attains a temperature of 300° C. or higher, the gas sources 45 and 46 are manipulated so that the first feedstock gas ($NH_3$) is jetted from the shower nozzle 12 toward the substrate 20 and, at the same time, the second feedstock gas ($WF_6$) is jetted from the nozzle 21 of the gas jet member 4. Thus, the first and second feedstock gases (i.e., the $NH_3$ and $WF_6$ gases) are blown onto the substrate 20.

In this case, two different feedstock gases (i.e., the $NH_3$ and $WF_6$ gases) are separately jetted respectively from the shower nozzle 12 and the gas jet member 4, as described above. By controlling the supply rates of the gases by manipulating the first gas source 41 and second gas source 42, the pressure in the adhesion preventive container 8 can be maintained with in the viscous flow region (i.e., 1.0 to 100 Pa) and the first feedstock gas and the second feedstock gas can separately attain the surface of the substrate 20 without being mixed together. As a result, the reaction of forming thin $W_xN$ proceeds on the surface of the substrate 20 and thus, a thin $W_xN$ film is obtained.

When the thin $W_xN$ film having a prescribed film thickness is formed, the substrate 20 is taken out from the reactor 11 and transported into a copper film forming apparatus. At the same time, another untreated substrate is carried into the reactor 11 and subjected to the formation of a thin $W_xN$ film. Thus, thin $W_xN$ films can be continuously formed.

In the above-described film forming apparatus 2, the adhesion preventive container 8 is filled up with the first feedstock gas and the second feedstock gas different from each other (i.e., the $NH_3$ and $WF_6$ gases), which protects the inner wall of the reactor 11 from the deposition of $WF_6 \cdot 4NH_3$ or $W_xN$ thereon. Thus, no dust evolves from the reactor 11 and a defect-free $W_xN$ film can be produced.

Since the temperature of the adhesion preventive container 8 is controlled within a range of from 200 to 300° C., neither $WF_6 \cdot 4NH_3$, which is liable to be formed at lower temperatures, nor $W_xN$, which is liable to be formed at higher temperatures, is formed. Thus, $W_xN$ can be formed in a dust-free environment. Moreover, the adhesion preventive container 8 can be easily cleaned because it is removable.

As described above, by using the thin film forming apparatus 2 according to the present invention, different feedstock gases are not mixed together, but can separately attain a substrate, and the reaction efficiently proceeds on the substrate surface. Thus, a thin film made of the reaction product (for example, a $W_xN$ film) can grow quickly without causing dusting and a $W_xN$ film with excellent qualities can be formed.

Although a number of holes 25 are formed in the inner side of the gas jet member 4 in the above case, other constitutions may be employed therefor so long as the feedstock gas can be uniformly jetted from two or more positions toward the substrate 20. For example, it is also possible that a tip 24 of the support 22 be bent toward the central axis of the substrate located below and the feedstock gas be jetted from the hole 26 formed on the tip 24, as FIG. 3(c) shows.

Although $W_xN$ is formed in a vacuum (under reduced pressure) of 1.0 to 100 Pa in the above example, it can be formed under higher pressure, i.e., atmospheric pressure or more.

By using the present invention, different feedstock gases are not mixed together but can separately attain the surface of an object on which a film is to be formed. Thus, the film-formation speed can be elevated and a uniform film thickness can be obtained.

Also, no reaction occurs on the surface of the adhesion preventive container and thus no dusting arises. In addition, the feedstock gases are not consumed on the surface of the adhesion preventive container. Therefore, the reaction can efficiently proceed on the surface of the object on which a film is to be formed and no dust adheres to the surface of the adhesion preventive container.

What is claimed is:

1. A method for producing a tungsten film comprising the steps of:

jetting a first feedstock gas having a nitrogen atom in its chemical structure and a second feedstock gas having a tungsten atom in its chemical structure into a reactor; and reacting said first feedstock gas with said second feedstock gas so as to form a tungsten nitride film on the surface of a material on which the film is to be formed, wherein the distance between the position from which said first feedstock gas is jetted and the surface of said material on which the film is to be formed is different from the distance between the position from which said second feedstock gas is jetted and the surface of said material on which the film is to be formed.

2. The method for producing a tungsten film as claimed in claim 1 further comprising the steps of:

providing an adhesion preventive container in said reactor and placing said object on which a film is to be formed in the adhesion preventive container;

heating, in said adhesion preventive container, at least the part around said material on which the film is to be formed to a temperature of between 150 and 250° C.; and jetting said first feedstock gas and second feedstock gas into said adhesion preventive container.

3. The method for producing a tungsten film as claimed in claim 2, wherein one of said first feedstock gas and second feedstock gas is jetted downward in the vertical direction toward the surface of said object on which a film is to be formed.

4. The method for producing a tungsten film as claimed in claim 3, wherein, between said first feedstock gas and second feedstock gas, the one gas jetted from the lower position is jetted sideways toward a center of said object on which a film is to be formed.

5. The method for producing a tungsten film as claimed in claim 2, wherein, between said first feedstock gas and second feedstock gas, the one gas jetted from the lower position is jetted sideways toward a center of said object on which a film is to be formed.

6. The method for producing a tungsten film as claimed in claim 1, wherein one of said first feedstock gas and second feedstock gas is jetted downward in the vertical direction toward the surface of said object on which a film is to be formed.

7. The method for producing a tungsten film as claimed in claim 6, wherein, between said first feedstock gas and second feedstock gas, the one gas jetted from the lower position is jetted sideways toward a center of said object on which a film is to be formed.

8. The method for producing a tungsten film as claimed in claim 1, wherein, between said first feedstock gas and second feedstock gas, the one gas jetted from the lower position is jetted sideways toward a center of said object on which a film is to be formed.

* * * * *